(12) United States Patent
Okazaki et al.

(10) Patent No.: US 12,069,816 B2
(45) Date of Patent: Aug. 20, 2024

(54) POWER CONVERSION DEVICE

(71) Applicant: Mitsubishi Electric Corporation, Tokyo (JP)

(72) Inventors: Taigi Okazaki, Tokyo (JP); Akifumi Shimono, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 178 days.

(21) Appl. No.: 17/897,800

(22) Filed: Aug. 29, 2022

(65) Prior Publication Data

US 2023/0121454 A1 Apr. 20, 2023

(30) Foreign Application Priority Data

Oct. 19, 2021 (JP) .................................. 2021-170739

(51) Int. Cl.
| | |
|---|---|
| *H05K 5/06* | (2006.01) |
| *H01R 13/52* | (2006.01) |
| *H01R 13/74* | (2006.01) |
| *H02M 7/00* | (2006.01) |
| *H05K 5/00* | (2006.01) |

(52) U.S. Cl.
CPC ........ *H05K 5/0069* (2013.01); *H01R 13/5202* (2013.01); *H01R 13/748* (2013.01); *H02M 7/003* (2013.01); *H05K 5/0056* (2013.01)

(58) Field of Classification Search
CPC ............... H05K 5/0069; H05K 5/0056; H01R 13/5202; H01R 13/748; H02M 7/003
See application file for complete search history.

(56) References Cited

U.S. PATENT DOCUMENTS

| | | | | |
|---|---|---|---|---|
| 2014/0196946 A1* | 7/2014 | Van Reybrouck | ...... | B60T 8/368 174/535 |
| 2020/0259290 A1* | 8/2020 | Hashii | ..... | H01R 12/58 |

FOREIGN PATENT DOCUMENTS

| | | | |
|---|---|---|---|
| JP | 2008-204802 A | 9/2008 | |
| JP | 2011108479 | * 6/2011 | ............. H01R 13/52 |
| JP | 2012-186075 A | 9/2012 | |
| JP | 2020-170651 A | 10/2020 | |

OTHER PUBLICATIONS

JP 2011108479 A, English translation (Year: 2011).*
Office Action issued Oct. 11, 2022 in Japanese Application No. 2021-170739.

* cited by examiner

*Primary Examiner* — Mukundbhai G Patel
(74) *Attorney, Agent, or Firm* — Sughrue Mion, PLLC; Richard C. Turner (57) ABSTRACT

Provided is a power conversion device, including: a casing that has a front surface with an opening; an insertion component including an insertion portion; and a gasket. The casing has an inner wall surface being in contact with the gasket and a casing-side guide surface. The insertion portion has an outer peripheral surface being in contact with the gasket and an insertion component-side guide surface. When a distance in the insertion direction between the front surface and an end of the casing-side guide surface, which is closer to the front surface in the insertion direction, is represented by L1 and a distance between an inner surface of the gasket in the insertion direction and a distal end of the insertion component-side guide surface in the insertion direction is represented by L2, the distance L2 is set larger than the distance L1.

7 Claims, 4 Drawing Sheets

POWER CONVERSION DEVICE

BACKGROUND OF THE INVENTION

Field of the Invention

This disclosure relates to a power conversion device including a gasket.

Description of the Related Art

In Patent Literature 1, a waterproof structure for a light-emitting diode unit is described. The waterproof structure includes a light-emitting diode chip, a housing, a holder, and a gasket. The light-emitting diode chip is enclosed in the housing. The housing has an opening for mounting the holder. The holder is mounted in the opening of the housing. The gasket is mounted onto an outer peripheral surface of the holder, and closes a space between an inner wall of the housing and the outer peripheral surface of the holder to achieve sealing.

CITATION LIST

Patent Literature

[PTL 1] JP 2012-186075 A

In an assembly step for the above-mentioned waterproof structure, the holder may be inserted into the opening of the housing under a misaligned state. When the holder is inserted into the opening under the misaligned state, the gasket may interfere with the housing to be undesirably turned over.

SUMMARY OF THE INVENTION

This disclosure has been made to solve the problem described above, and has an object to provide a power conversion device including a gasket which can prevent the gasket from being turned over.

According to this disclosure, there is provided a power conversion device, including: a casing that has a front surface with an opening, and is configured to accommodate electrical components; an insertion component including an insertion portion inserted from the front surface side into the opening; and a gasket provided between the insertion portion and the opening, wherein the casing has an inner wall surface being in contact with the gasket and a casing-side guide surface located on an inner side of the casing with respect to the inner wall surface in an insertion direction for the insertion portion, wherein the casing-side guide surface is located on an inner periphery side of the opening with respect to the inner wall surface, wherein the insertion portion has an outer peripheral surface being in contact with the gasket and at least one insertion component-side guide surface located on the inner side of the casing with respect to the outer peripheral surface in the insertion direction, wherein the at least one insertion component-side guide surface is opposed to the casing-side guide surface, wherein, when a distance in the insertion direction between the front surface and an end of the casing-side guide surface, which is closer to the front surface in the insertion direction, is represented by L1 and a distance between an inner surface of the gasket in the insertion direction and a distal end of the at least one insertion component-side guide surface in the insertion direction is represented by L2, the distance L2 is set larger than the distance L1.

According to this disclosure, the gasket can be prevented from being turned over.

DESCRIPTION OF THE EMBODIMENT

First Embodiment

A power conversion device according to a first embodiment is now described. The power conversion device includes a power converter such as an inverter. The power conversion device converts power supplied from a power source into AC power at a predetermined voltage, and supplies the AC power to a load. The load is, for example, a motor.

Figure 1:
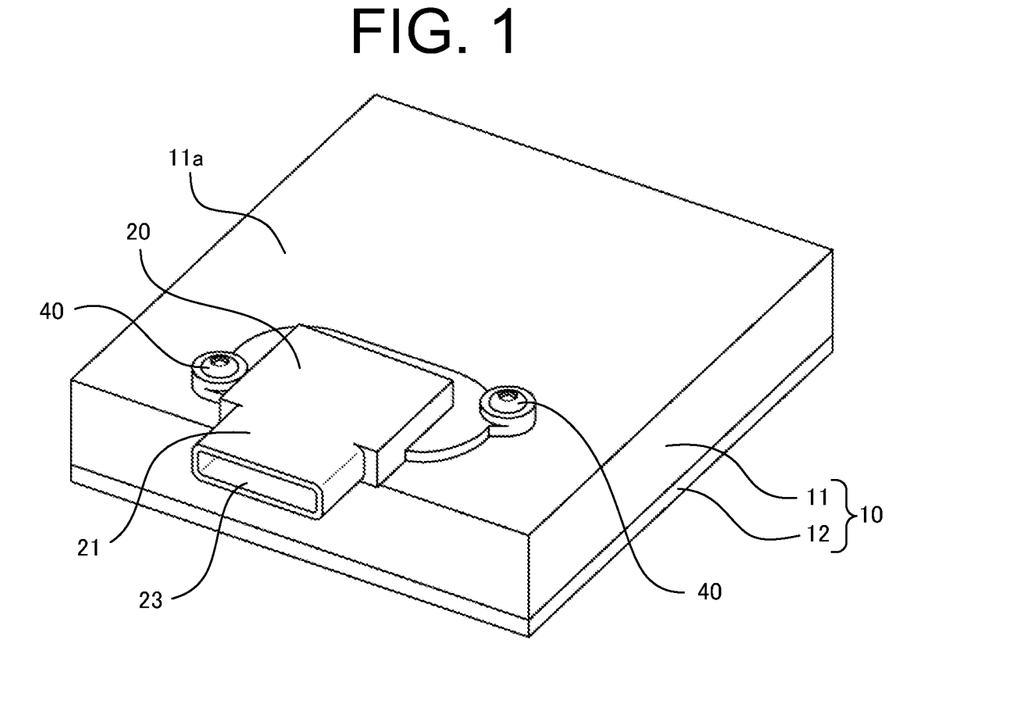
FIG. 1 is a perspective view for illustrating an exterior of a power conversion device according to a first embodiment.
Figure 2:
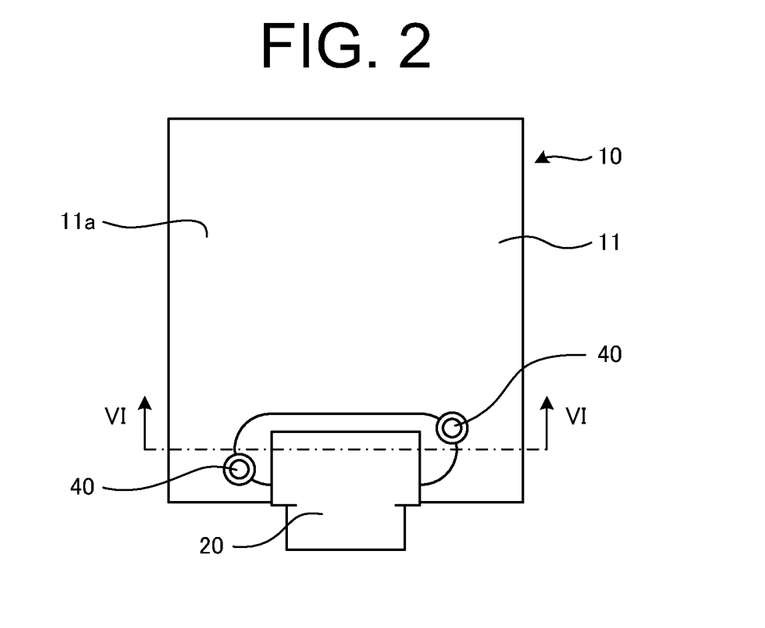
FIG. 2 is a top view for illustrating the exterior of the power conversion device according to the first embodiment.
Figure 3:
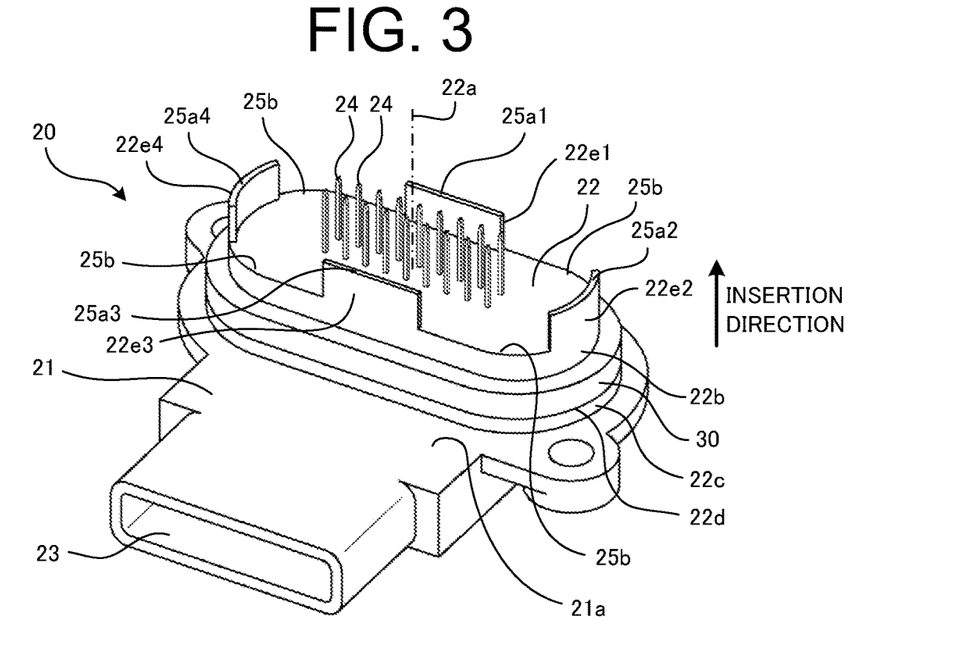
FIG. 3 is a perspective view for illustrating configurations of a connector and a gasket of the power conversion device according to the first embodiment.
Figure 4:
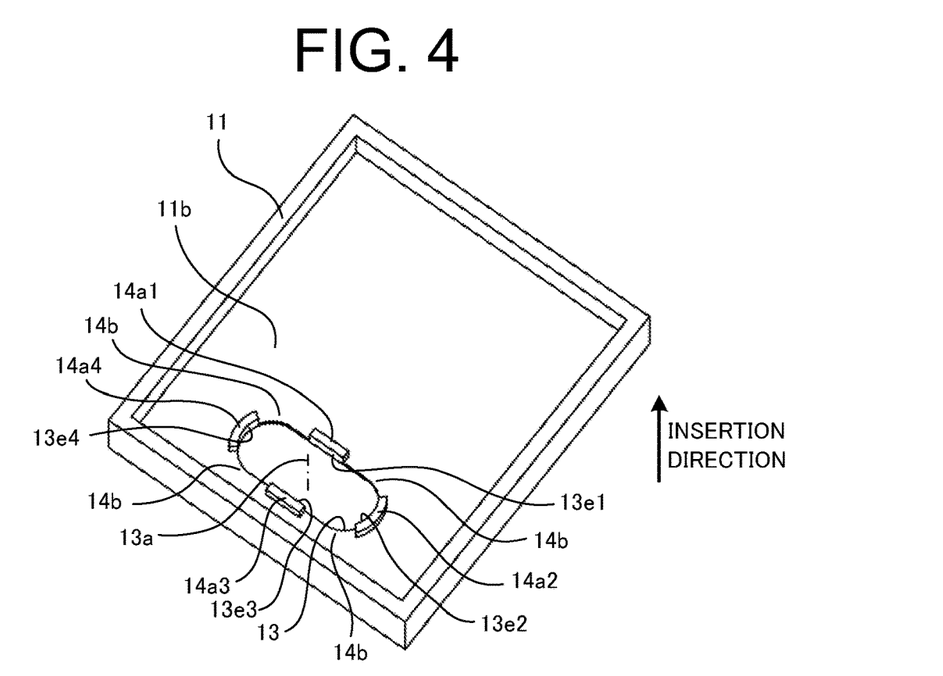
FIG. 4 is a perspective view for illustrating a configuration of a casing main body of the power conversion device according to the first embodiment when viewed from an inside.
Figure 5:
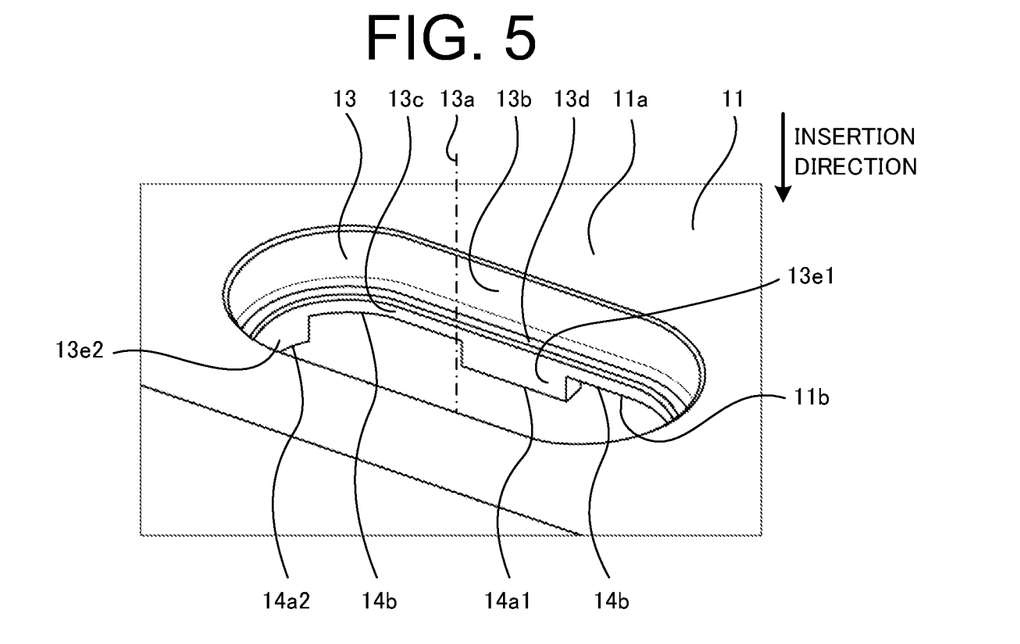
FIG. 5 is a perspective view for illustrating a configuration of an opening of the casing main body of the power conversion device according to the first embodiment when viewed from an outside.
Figure 6:
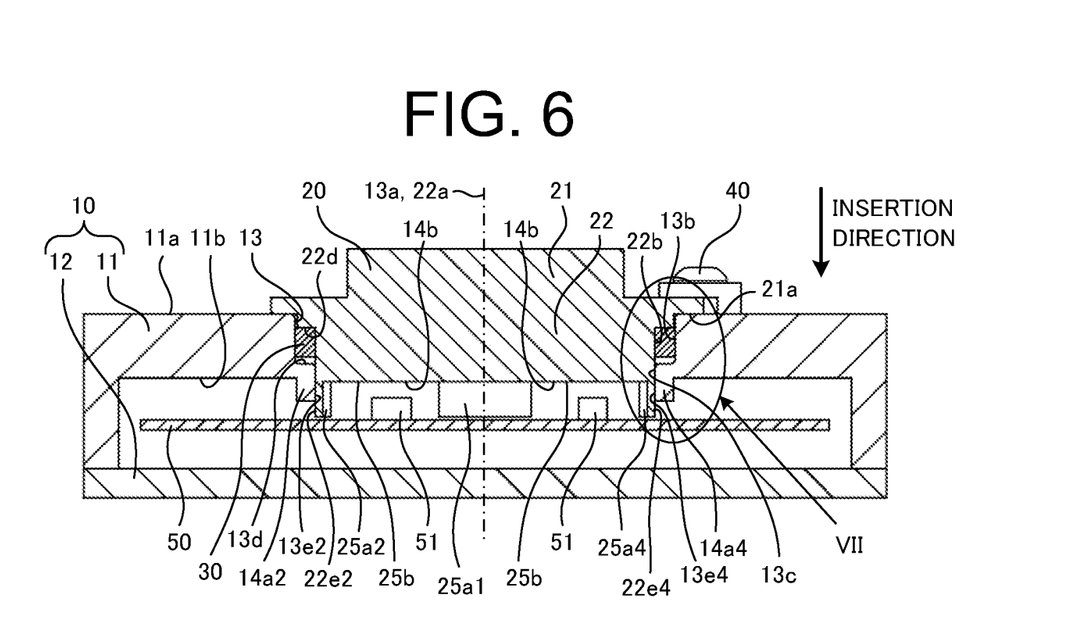
FIG. 6 is a sectional view taken along the line VI-VI of FIG. 2.
Figure 7:
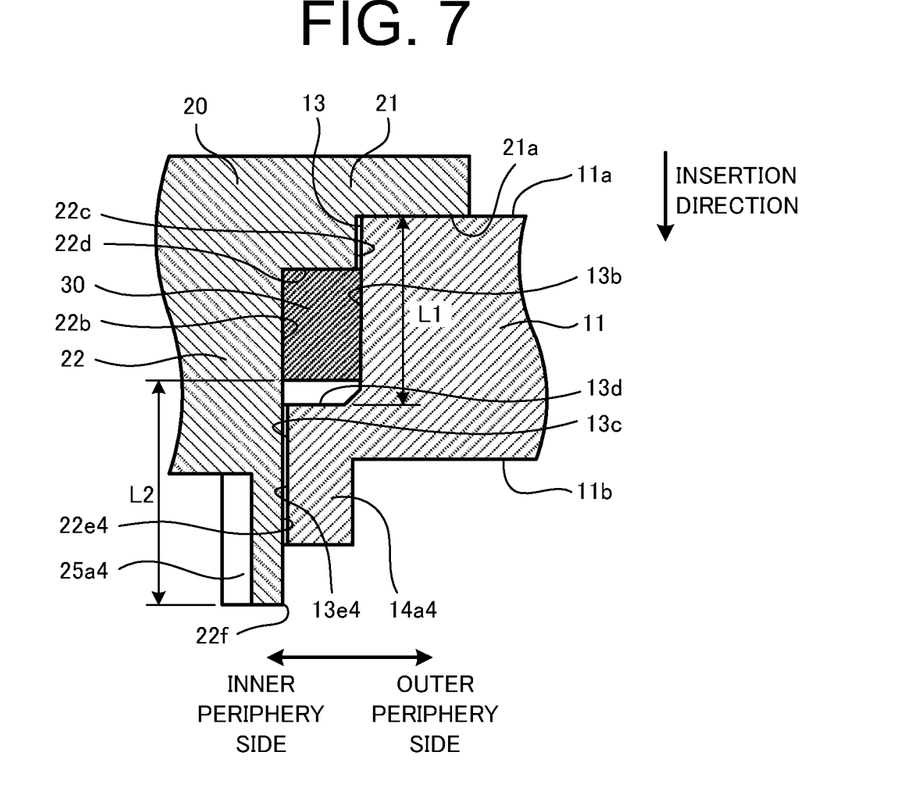
FIG. 7 is an enlarged view of a region VII of FIG. 6.

FIG. 1 is a perspective view for illustrating an exterior of the power conversion device according to this embodiment. FIG. 2 is a top view for illustrating the exterior of the power conversion device according to this embodiment. FIG. 3 is a perspective view for illustrating configurations of a connector and a gasket of the power conversion device according to this embodiment. FIG. 4 is a perspective view for illustrating a configuration of a casing main body of the power conversion device according to this embodiment when viewed from an inside. FIG. 5 is a perspective view for illustrating a configuration of an opening of the casing main body of the power conversion device according to this embodiment when viewed from an outside. FIG. 6 is a sectional view taken along the line VI-VI of FIG. 2. FIG. 7 is an enlarged view of a region VII of FIG. 6.

In FIG. 3 and FIG. 4, an upward direction corresponds to a direction in which an insertion portion 22 of a connector 20 is inserted into an opening 13, specifically, an insertion direction. A lower side of FIG. 3 and FIG. 4 corresponds to an outer side of a casing 10 in the insertion direction. An upper side of FIG. 3 and FIG. 4 corresponds to an inner side of the casing 10 in the insertion direction. In FIG. 5 to FIG. 7, a downward direction corresponds to the insertion direction. An upper side of FIG. 5 to FIG. 7 corresponds to the outer side of the casing 10 in the insertion direction. A lower side of FIG. 5 to FIG. 7 corresponds to the inner side of the casing 10 in the insertion direction.

As illustrated in FIG. 1 to FIG. 7, the power conversion device includes the casing 10, the connector 20, and a gasket 30. Electrical components 51 and a control board 50 are accommodated in the casing 10. The electrical components 51 form the power converter. The electrical components 51 are mounted on the control board 50.

The casing 10 has a rectangular parallelepiped box shape. The casing 10 includes a casing main body 11 and a cover 12. One side of the casing main body 11, specifically, a lower side of the casing main body 11 in FIG. 1 is open. The open side of the casing main body 11 is closed with the cover 12.

The casing main body 11 has a front surface 11a and a back surface 11b. The front surface 11a has a flat-surface shape. The front surface 11a has the opening 13. The opening 13 extends from the front surface 11a to the back surface 11b to pass through the casing main body 11. In this embodiment, the opening 13 has an elongated ellipsoidal shape in plan view. However, a shape of the opening 13 in plan view is not limited to an elongated ellipsoidal shape. A center axis 13a of the opening 13 is perpendicular to the front surface 11a. Further, the center axis 13a is parallel to the insertion direction.

The back surface 11b is located on a back side of the front surface 11a. The back surface 11b is exposed to an internal space of the casing 10. A plurality of casing-side guide portions 14a1, 14a2, 14a3, and 14a4 are formed on the back surface 11b. The casing-side guide portions 14a1 to 14a4 protrude from the back surface 11b to an inside of the casing 10. The casing-side guide portions 14a1 to 14a4 are formed along a periphery of the opening 13.

When viewed in the insertion direction, the casing-side guide portions 14a1 to 14a4 are arranged at 90-degree intervals about the center axis 13a. The casing-side guide portions 14a1 to 14a4 have second casing-side guide surfaces 13e1, 13e2, 13e3, and 13e4 described later, respectively.

The casing main body 11 has an inner wall surface 13b, a first casing-side guide surface 13c, a casing-side stepped surface 13d, and the plurality of second casing-side guide surfaces 13e1 to 13e4. The inner wall surface 13b, the first casing-side guide surface 13c, the casing-side stepped surface 13d, and the plurality of second casing-side guide surfaces 13e1 to 13e4 are located inside the opening 13, and are exposed to an internal space of the opening 13.

The inner wall surface 13b is in contact with the gasket 30. The inner wall surface 13b is adjacent to the front surface 11a. The inner wall surface 13b is formed so as to be parallel to the center axis 13a, specifically, perpendicular to the front surface 11a. The inner wall surface 13b is formed along the entire periphery of the opening 13.

The first casing-side guide surface 13c is located on the inner side of the casing 10 with respect to the inner wall surface 13b in the insertion direction. The first casing-side guide surface 13c is adjacent to the back surface 11b. The first casing-side guide surface 13c is formed so as to be parallel to the center axis 13a, specifically, perpendicular to the front surface 11a. The first casing-side guide surface 13c is located on an inner periphery side of the opening 13 with respect to the inner wall surface 13b, specifically, located closer to the center axis 13a than the inner wall surface 13b. The first casing-side guide surface 13c is formed along the entire periphery of the opening 13.

The casing-side stepped surface 13d is located between the inner wall surface 13b and the first casing-side guide surface 13c. Specifically, the casing-side stepped surface 13d is located on the inner side of the casing 10 with respect to the gasket 30 and on the outer side of the casing 10 with respect to the first casing-side guide surface 13c in the insertion direction. The casing-side stepped surface 13d faces the outer side of the casing 10 in the insertion direction, specifically, toward the gasket 30. The casing-side stepped surface 13d is formed along the entire periphery of the opening 13. The casing-side stepped surface 13d may be formed in parallel to the front surface 11a.

The second casing-side guide surfaces 13e1 to 13e4 are located on the inner side of the casing 10 with respect to the first casing-side guide surface 13c in the insertion direction. The casing-side guide portion 14a1 has the second casing-side guide surface 13e1. The casing-side guide portion 14a2 has the second casing-side guide surface 13e2. The casing-side guide portion 14a3 has the second casing-side guide surface 13e3. The casing-side guide portion 14a4 has the second casing-side guide surface 13e4.

The second casing-side guide surfaces 13e1 to 13e4 are continuous with the first casing-side guide surface 13c, and extend from the first casing-side guide surface 13c in the insertion direction. Each of the second casing-side guide surfaces 13e1 to 13e4 is formed so as to be in parallel to the center axis 13a, specifically, perpendicular to the front surface 11a. The second casing-side guide surfaces 13e1 to 13e4 are flush and continuous with the first casing-side guide surface 13c.

The second casing-side guide surfaces 13e1 to 13e4 function together with the first casing-side guide surface 13c as a casing-side guide surface that guides the insertion portion 22. In the following description, the first casing-side guide surface 13c and the second casing-side guide surfaces 13e1 to 13e4 are also collectively referred to as "casing-side guide surface".

The second casing-side guide surfaces 13e1 to 13e4 are separated from each other in a circumferential direction of the opening 13. The second casing-side guide surfaces 13e1 to 13e4 are arranged along the periphery of the opening 13 so as to be spaced apart from each other. When viewed in the insertion direction, the second casing-side guide surfaces 13e1 to 13e4 are arranged at 90-degree intervals about the center axis 13a. A gap 14b is defined between adjacent two of the second casing-side guide surfaces for all the second casing-side guide surfaces. When viewed in the insertion direction, the electrical components 51 are arranged so as to overlap with the gaps 14b.

When viewed in the insertion direction, a position of the second casing-side guide surface 13e1 and a position of the second casing-side guide surface 13e3 are different from each other by 180 degrees about the center axis 13a. Similarly, when viewed in the insertion direction, a position of the second casing-side guide surface 13e2 and a position of the second casing-side guide surface 13e4 are different from each other by 180 degrees about the center axis 13a.

The connector 20 is an insertion component mounted into the casing 10. The connector 20 includes a connector main body portion 21 and the insertion portion 22. The connector main body portion 21 is exposed from the casing 10. The connector main body portion 21 has a port 23 into which a mating connector (not shown) is to be inserted. The connector main body portion 21 is fastened to the casing 10 with screws 40.

The connector main body portion 21 is formed in a flange shape extending from the insertion portion 22. The connector main body portion 21 has a flange surface 21a having a flat-surface shape, and the flange surface 21a surrounds the insertion portion 22. The flange surface 21a is formed so as to be perpendicular to a center axis 22a of the insertion portion 22. The flange surface 21a faces the inner side of the casing 10 in the insertion direction. The flange surface 21a faces the front surface 11a of the casing 10. The flange surface 21a is in contact with the front surface 11a.

The insertion portion 22 is inserted into the opening 13 from the front surface 11a side. The insertion portion 22 protrudes from the connector main body portion 21 to extend in the insertion direction. The insertion portion 22 has the same sectional shape as the shape of the opening 13 in plan view. The center axis 22a of the insertion portion 22 is perpendicular to the flange surface 21a. The center axis 22a of the insertion portion 22 matches the center axis 13a of the opening 13. As a result, the flange surface 21a is parallel to the front surface 11a. The center axis 22a and the center axis 13a are parallel to the insertion direction.

A plurality of terminals 24 and a plurality of connector-side guide portions 25a1, 25a2, 25a3, and 25a4 are formed at an end of the insertion portion 22 in the insertion direction. The terminals 24 are electrically connected to the control board 50 in the casing 10 via a connecting member such as a solder. As a result, a signal can be input from an outside to the power conversion device and output from the power conversion device to the outside through the connector 20.

The connector-side guide portions 25a1 to 25a4 are formed along an outer periphery of the insertion portion 22. The connector-side guide portions 25a1 to 25a4 protrude from the end of the insertion portion 22 in the insertion direction to the inside of the casing 10.

When viewed in the insertion direction, the connector-side guide portions 25a1 to 25a4 are arranged at 90-degree intervals about the center axis 22a. The connector-side guide portions 25a1 to 25a4 have connector-side guide surfaces 22e1, 22e2, 22e3, and 22e4 described later, respectively.

The insertion portion 22 has a first outer peripheral surface 22b, a second outer peripheral surface 22c, a connector-side stepped surface 22d, and the plurality of connector-side guide surfaces 22e1 to 22e4. The first outer peripheral surface 22b, the second outer peripheral surface 22c, the connector-side stepped surface 22d, and the plurality of connector-side guide surfaces 22e1 to 22e4 are located on the outer periphery side of the insertion portion 22.

The first outer peripheral surface 22b is in contact with the gasket 30. The first outer peripheral surface 22b is opposed to the inner wall surface 13b of the casing main body 11 with the gasket 30 interposed therebetween. Further, the first outer peripheral surface 22b is opposed to the first casing-side guide surface 13c of the casing main body 11. A clearance is defined between the first outer peripheral surface 22b and the first casing-side guide surface 13c. This clearance is set in consideration of component dimensional tolerances of the casing main body 11 and the connector 20 so as not to make the insertion of the insertion portion 22 into the opening 13 difficult. The first outer peripheral surface 22b is formed so as to be parallel to the center axis 22a, specifically, perpendicular to the flange surface 21a. The first outer peripheral surface 22b is formed along the entire periphery of the insertion portion 22.

The second outer peripheral surface 22c is located between the first outer peripheral surface 22b and the flange surface 21a in the insertion direction. The second outer peripheral surface 22c is adjacent to the flange surface 21a. The second outer peripheral surface 22c is located on the outer periphery side of the insertion portion 22 with respect to the first outer peripheral surface 22b. The second outer peripheral surface 22c is opposed to the inner wall surface 13b of the casing main body 11 with a clearance. The second outer peripheral surface 22c may be in contact with the inner wall surface 13b. The second outer peripheral surface 22c is formed along the entire periphery of the insertion portion 22.

The connector-side stepped surface 22d is located on the outer side of the casing 10 with respect to the gasket 30 in the insertion direction. The connector-side stepped surface 22d is located between the first outer peripheral surface 22b and the second outer peripheral surface 22c. The connector-side stepped surface 22d faces the inner side of the casing 10 in the insertion direction, specifically, toward the gasket 30. The connector-side stepped surface 22d is formed along the entire periphery of the insertion portion 22. The gasket 30 is in contact with the connector-side stepped surface 22d. The connector-side stepped surface 22d is opposed to the casing-side stepped surface 13d with the gasket 30 interposed therebetween. The connector-side stepped surface 22d is formed so as to be parallel to the flange surface 21a.

The connector-side guide surfaces 22e1 to 22e4 are located on the inner side of the casing 10 with respect to the first outer peripheral surface 22b in the insertion direction. Specifically, the connector-side guide surfaces 22e1 to 22e4 are located on the inner side of the casing 10 with respect to the first outer peripheral surface 22b in the insertion direction.

The connector-side guide portion 25a1 has the connector-side guide surface 22e1. The connector-side guide portion 25a2 has the connector-side guide surface 22e2. The connector-side guide portion 25a3 has the connector-side guide surface 22e3. The connector-side guide portion 25a4 has the connector-side guide surface 22e4.

The connector-side guide surfaces 22e1 to 22e4 are continuous with the first outer peripheral surface 22b, and extend from the first outer peripheral surface 22b in the insertion direction. Each of the connector-side guide surfaces 22e1 to 22e4 is formed so as to be in parallel to the center axis 22a, specifically, perpendicular to the flange surface 21a. The connector-side guide surfaces 22e1 to 22e4 are flush and continuous with the first outer peripheral surface 22b.

The connector-side guide surfaces 22e1 to 22e4 are separated from each other in a circumferential direction of the insertion portion 22. The connector-side guide surfaces 22e1 to 22e4 are arranged along the periphery of the insertion portion 22 so as to be spaced apart from each other. When viewed in the insertion direction, the connector-side guide surfaces 22e1 to 22e4 are arranged at 90-degree intervals about the center axis 22a. The connector-side guide surfaces 22e1 to 22e4 are located at positions corresponding to the second casing-side guide surfaces 13e1 to 13e4, respectively. For example, the connector-side guide surfaces 22e1 to 22e4 and the second casing-side guide surfaces 13e1 to 13e4 are formed only at positions that are required for alignment of the insertion portion 22 and the opening 13.

A gap 25b is defined between adjacent two of the connector-side guide surfaces 22e1 to 22e4 for all the connector-side guide surfaces 22e1 to 22e4. When viewed in the insertion direction, the electrical components 51 are arranged so as to overlap with the gaps 25b.

When viewed in the insertion direction, a position of the connector-side guide surface 22e1 and a position of the connector-side guide surface 22e3 are different from each other by 180 degrees about the center axis 22a. Similarly, when viewed in the insertion direction, a position of the connector-side guide surface 22e2 and a position of the connector-side guide surface 22e4 are different from each other by 180 degrees about the center axis 22a.

The connector-side guide surface 22e1 is opposed to the second casing-side guide surface 13e1. A clearance is defined between the connector-side guide surface 22e1 and the second casing-side guide surface 13e1. The connector-side guide surface 22e2 is opposed to the second casing-side guide surface 13e2. A clearance is defined between the connector-side guide surface 22e2 and the second casing-side guide surface 13e2. The connector-side guide surface 22e3 is opposed to the second casing-side guide surface 13e3. A clearance is defined between the connector-side guide surface 22e3 and the second casing-side guide surface 13e3. The connector-side guide surface 22e4 is opposed to the second casing-side guide surface 13e4. A clearance is defined between the connector-side guide surface 22e4 and the second casing-side guide surface 13e4. These clearances are set in consideration of the component dimensional tolerances of the casing main body 11 and the connector 20 so as not to make the insertion of the insertion portion 22 into the opening 13 difficult. The connector-side guide surfaces 22e1 to 22e4 may be opposed to the first casing-side guide surface 13c. In this case, a clearance is also defined between each of the connector-side guide surfaces 22e1 to 22e4 and the first casing-side guide surface 13c.

The gasket 30 has an annular shape. The gasket 30 is provided between the insertion portion 22 and the opening 13. The gasket 30 is mounted onto the first outer peripheral surface 22b of the insertion portion 22. The gasket 30 is in close contact with both of the first outer peripheral surface 22b and the inner wall surface 13b of the casing main body 11 over its entire periphery. When the gasket 30 is provided between the first outer peripheral surface 22b and the inner wall surface 13b to achieve sealing, a waterproof structure that prevents intrusion of water into the casing 10 is completed.

Further, the gasket 30 is in contact with the connector-side stepped surface 22d over its entire periphery. As a result, the gasket 30 is positioned in the insertion direction.

In this case, a distance in the insertion direction between the front surface 11a and an end of the first casing-side guide surface 13c, which is closer to the front surface 11a in the insertion direction, is represented by L1. A distance in the insertion direction between an inner surface of the gasket 30 in the insertion direction and each of distal ends 22f of the connector-side guide surfaces 22e1 to 22e4 in the insertion direction is represented by L2. The distance L2 is set larger than the distance L1 (L2>L1) in this case.

Figure 8:
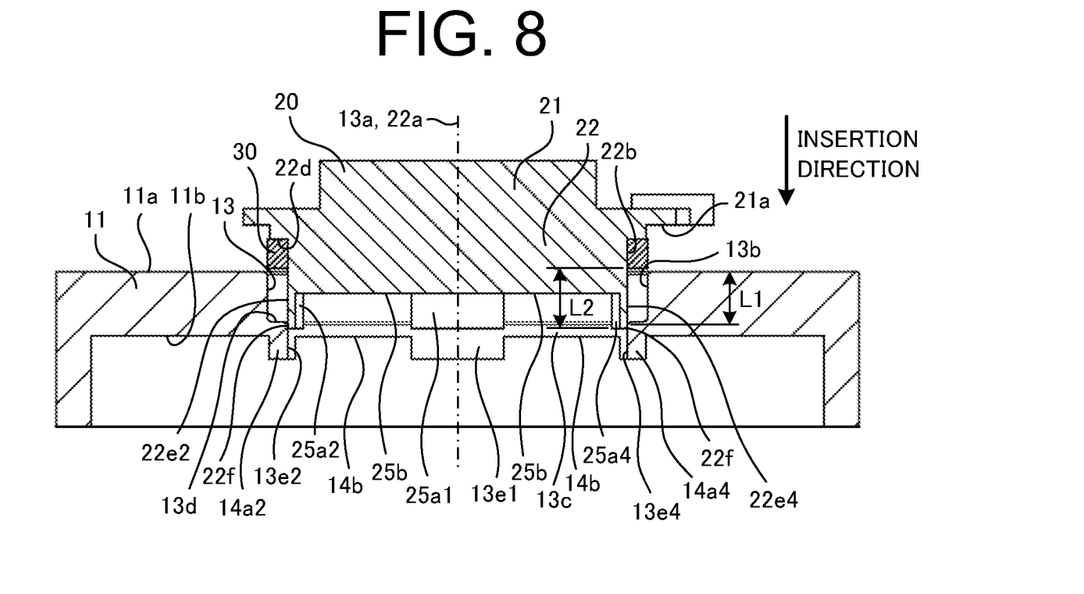
FIG. 8 is a sectional view for illustrating a step of inserting an insertion portion of the connector into the opening in a manufacturing process for the power conversion device according to the first embodiment.

FIG. 8 is a sectional view for illustrating a step of inserting the insertion portion of the connector into the opening in a manufacturing process for the power conversion device according to this embodiment. In FIG. 8, a downward direction corresponds to a direction in which the insertion portion 22 is inserted into the opening 13, specifically, the insertion direction. An upper side of FIG. 8 corresponds to the outer side of the casing 10 in the insertion direction. A lower side of FIG. 8 corresponds to the inner side of the casing 10 in the insertion direction.

The gasket 30 has already been mounted onto the first outer peripheral surface 22b of the insertion portion 22 before the step of inserting the insertion portion 22 into the opening 13 is carried out. The gasket 30 is in contact with the connector-side stepped surface 22d over its entire periphery.

As illustrated in FIG. 8, in the step of inserting the insertion portion 22 of the connector 20 into the opening 13, the distal ends 22f of the connector-side guide surfaces 22e1 to 22e4 are inserted on the inner periphery side of the first casing-side guide surface 13c. In this manner, the insertion portion 22 and the opening 13 are substantially aligned with each other, and the center axis 22a of the insertion portion 22 and the center axis 13a of the opening 13 substantially match each other. As described above, however, the clearance is set in consideration of the component dimensional tolerances between each of the connector-side guide surfaces 22e1 to 22e4 and the casing-side guide surface. Thus, at this time, a misalignment corresponding to the above-mentioned clearance is allowed between the center axis 22a and the center axis 13a. At this time, the gasket 30 is not inserted into the opening 13 yet.

When the insertion portion 22 is further inserted in the insertion direction, the gasket 30 is inserted into the opening 13. The gasket 30 is inserted together with the insertion portion 22 into the opening 13 while the center axis 22a and the center axis 13a substantially match each other. When the gasket 30 is inserted into the opening 13, the center axis 22a and the center axis 13a match each other through an action such as a reaction force of the gasket 30.

After that, the insertion portion 22 is inserted into the opening 13 until the flange surface 21a is brought into contact with the front surface 11a. In this manner, the insertion portion 22 is inserted into the opening 13 while the center axis 22a and the center axis 13a match each other. The gasket 30, which has been inserted into the opening 13, is in close contact with both of the first outer peripheral surface 22b of the insertion portion 22 and the inner wall surface 13b of the casing main body 11. A position of the gasket 30 is determined by the connector-side stepped surface 22d in a direction in which the center axis 22a and the center axis 13a extend.

In the power conversion device according to this embodiment, the distance L2 is set larger than the distance L1. Thus, as illustrated in FIG. 8, before the gasket 30 is inserted into the opening 13, specifically, before the gasket 30 is brought into contact with the front surface 11a of the casing main body 11, the insertion portion 22 and the opening 13 are substantially aligned with each other. Thus, the gasket 30 is inserted into the opening 13 under a state in which the insertion portion 22 and the opening 13 have been substantially aligned with each other. Thus, according to this embodiment, the gasket 30 can be prevented from being brought into contact with the front surface 11a under a state in which the insertion portion 22 and the opening 13 are misaligned. This configuration prevents the gasket 30 from being turned over.

It is conceivable to provide a pin to the connector and form a pin hole in the casing main body as a guide structure for aligning the insertion portion and the opening. In this case, however, to achieve the alignment of the insertion portion and the opening before the insertion of the gasket into the opening, the pin is required to have a long length and the pin hole is required to have a large depth. As a result, the arrangement of the electrical components inside the casing becomes disadvantageously complicated, and a height dimension of the power conversion device in the insertion direction for the insertion portion undesirably increases.

Meanwhile, in this embodiment, as illustrated in FIG. 6, when viewed in the insertion direction, the electrical components 51 are arranged so as to overlap with the gaps 25b. Specifically, when viewed in the insertion direction, the electrical components 51 are arranged so as not to overlap with the connector-side guide surfaces 22e1 to 22e4. Thus, an increase in height dimension of the power conversion device in the insertion direction can be suppressed while the lengths of the connector-side guide surfaces 22e1 to 22e4 in the insertion direction are increased. Specifically, even when the distance L2 is increased, an increase in height dimension of the power conversion device can be suppressed.

Further, in this embodiment, when viewed in the insertion direction, the electrical components 51 are arranged so as to overlap with the gaps 14*b*. Specifically, when viewed in the insertion direction, the electrical components 51 are arranged so as not to overlap with the second casing-side guide surfaces 13*e*1 to 13*e*4. Thus, an increase in height dimension of the power conversion device in the insertion direction can be suppressed while the lengths of the second casing-side guide surfaces 13*e*1 to 13*e*4 in the insertion direction are increased.

Further, in this embodiment, the lengths of the connector-side guide surfaces and the casing-side guide surface in the insertion direction can be increased. Thus, accuracy of the alignment of the insertion portion 22 and the opening 13 can be increased.

In this embodiment, the connector-side guide surfaces 22*e*1 to 22*e*4 are arranged at 90-degree intervals about the center axis 22*a*. For example, in a cross section illustrated in FIG. 6, the connector-side guide surface 22*e*2 and the connector-side guide surface 22*e*4 are arranged at positions different from each other by 180 degrees about the center axis 22*a*. Thus, in the step of inserting the insertion portion 22 into the opening 13, inclination of the insertion portion 22 with respect to the center axis 13*a* of the opening 13 can be regulated by the connector-side guide surface 22*e*2 and the connector-side guide surface 22*e*4. In this case, the inclination of the insertion portion 22, which is regulated by the connector-side guide surface 22*e*2 and the connector-side guide surface 22*e*4, refers to inclination of the insertion portion 22 in a rotation direction about an axis extending in a direction perpendicular to a drawing sheet of FIG. 6.

Similarly, the connector-side guide surface 22*e*1 and the connector-side guide surface 22*e*3 are arranged at positions different from each other by 180 degrees about the center axis 22*a*. Thus, in the step of inserting the insertion portion 22 into the opening 13, inclination of the insertion portion 22 with respect to the center axis 13*a* of the opening 13 can also be regulated by the connector-side guide surface 22*e*1 and the connector-side guide surface 22*e*3. In this case, the inclination of the insertion portion 22, which is regulated by the connector-side guide surface 22*e*1 and the connector-side guide surface 22*e*3, refers to inclination of the insertion portion 22 in a rotation direction about an axis extending in a right-and-left direction of FIG. 6.

As described above, the power conversion device according to this embodiment includes the casing 10, the connector 20, and the gasket 30. The casing 10 has the front surface 11*a* with the opening 13. The casing 10 accommodates the electrical components 51. The connector 20 includes the insertion portion 22. The insertion portion 22 is inserted into the opening 13 from the front surface 11*a* side. The gasket 30 is provided between the insertion portion 22 and the opening 13.

The casing 10 has the inner wall surface 13*b* and the casing-side guide surface. The casing-side guide surface includes the first casing-side guide surface 13*c* and the second casing-side guide surfaces 13*e*1 to 13*e*4. The inner wall surface 13*b* is in contact with the gasket 30. The casing-side guide surfaces are located on the inner side of the casing 10 with respect to the inner wall surface 13*b* in the insertion direction. The casing-side guide surface is located on the inner periphery side of the opening 13 with respect to the inner wall surface 13*b*.

The insertion portion 22 has the first outer peripheral surface 22*b* and the connector-side guide surfaces 22*e*1 to 22*e*4. The first outer peripheral surface 22*b* is in contact with the gasket 30. The connector-side guide surfaces 22*e*1 to 22*e*4 are located on the inner side of the casing 10 with respect to the first outer peripheral surface 22*b* in the insertion direction. The connector-side guide surfaces 22*e*1 to 22*e*4 are opposed to the casing-side guide surface.

The distance in the insertion direction between the front surface 11*a* and the end of the first casing-side guide surface 13*c*, which is closer to the front surface 11*a* in the insertion direction, is represented by L1. The distance in the insertion direction between the inner surface of the gasket 30 in the insertion direction and each of the distal ends 22*f* of the connector-side guide surfaces 22*e*1 to 22*e*4 is represented by L2. In this case, the distance L2 is set larger than the distance L1.

In this embodiment, the connector 20 is an example of an insertion component. The first outer peripheral surface 22*b* is an example of an outer peripheral surface. The connector-side guide surfaces 22*e*1 to 22*e*4 are an example of insertion component-side guide surfaces.

In this configuration, the distance L2 is set larger than the distance L1. Thus, the insertion portion 22 and the opening 13 can be substantially aligned with each other before the gasket 30 is brought into contact with the front surface 11*a*. Thus, the contact of the gasket 30 with the front surface 11*a* under the state in which the insertion portion 22 and the opening 13 are misaligned can be prevented. Thus, the gasket 30 can be prevented from being turned over. Accordingly, waterproofness of the power conversion device can be ensured.

In the power conversion device according to this embodiment, the plurality of connector-side guide surfaces 22*e*1 to 22*e*4 are arranged along the periphery of the insertion portion 22. The gap 25*b* is defined between adjacent two of the connector-side guide surfaces 22*e*1 to 22*e*4 for all the connector-side guide surfaces 22*e*1 to 22*e*4. When viewed in the insertion direction, the electrical components 51 are arranged so as to overlap with the gaps 25*b*. In this case, the gaps 25*b* are an example of first gaps.

The above-mentioned configuration can suppress an increase in height dimension of the power conversion device in the insertion direction while the lengths of the connector-side guide surfaces 22*e*1 to 22*e*4 in the insertion direction are increased.

In the power conversion device according to this embodiment, when viewed in the insertion direction, the position of the connector-side guide surface 22*e*2 and the position of the connector-side guide surface 22*e*4 are different from each other by 180 degrees about the center axis 22*a* of the insertion portion 22. Similarly, when viewed in the insertion direction, the position of the connector-side guide surface 22*e*1 and the position of the connector-side guide surface 22*e*3 are different from each other by 180 degrees about the center axis 22*a* of the insertion portion 22. In this case, each of the connector-side guide surface 22*e*2 and the connector-side guide surface 22*e*1 is an example of a first insertion component-side guide surface. Each of the connector-side guide surface 22*e*4 and the connector-side guide surface 22*e*3 is an example of a second insertion component-side guide surface.

This configuration enables the regulation of the inclination of the insertion portion 22 with respect to the center axis 13*a* of the opening 13.

In the power conversion device according to this embodiment, the connector 20 further has the flange surface 21*a*. The flange surface 21*a* is in contact with the front surface 11*a*. The insertion portion 22 further has the connector-side stepped surface 22*d*. The connector-side stepped surface 22*d* faces the inner side of the casing 10 in the insertion direction. The connector-side stepped surface 22d is located on the outer side of the casing 10 with respect to the gasket 30 in the insertion direction. The gasket 30 is in contact with the connector-side stepped surface 22d. In this case, the connector-side stepped surface 22d is an example of an insertion component-side stepped surface.

With this configuration, the position of the gasket 30 in the insertion direction can be determined by the connector-side stepped surface 22d. Thus, when the insertion portion 22 is inserted into the opening 13 until the flange surface 21a is brought into contact with the front surface 11a, the gasket 30 can be positioned in the insertion direction.

In the power conversion device according to this embodiment, the connector-side guide surfaces 22e1 to 22e4 are flush and continuous with the first outer peripheral surface 22b. This configuration allows simplification of a shape of the insertion portion 22 of the connector 20.

In the power conversion device according to this embodiment, the casing 10 further has the casing-side stepped surface 13d. The casing-side stepped surface 13d faces the outer side of the casing 10 in the insertion direction. The casing-side stepped surface 13d is located between the inner wall surface 13b and the first casing-side guide surface 13c.

With the configuration described above, when the insertion portion 22 is inserted into the opening 13, or after the insertion portion 22 is inserted into the opening 13, the casing-side stepped surface 13d functions as a retainer that prevents the gasket 30 from coming off the insertion portion 22. Thus, the first outer peripheral surface 22b of the insertion portion 22 is not required to have a groove for receiving the gasket 30. Thus, when the connector 20 is a molded component formed by using a die, a slide mold for forming a groove is not needed. Thus, a die structure for forming the connector 20 can be simplified, and hence manufacturing cost for the power conversion device can be reduced.

In the power conversion device according to this embodiment, the casing-side guide surface includes the first casing-side guide surface 13c and the plurality of second casing-side guide surfaces 13e1 to 13e4. The plurality of second casing-side guide surfaces 13e1 to 13e4 are located on the inner side of the casing 10 with respect to the first casing-side guide surface 13c in the insertion direction. The plurality of second casing-side guide surfaces 13e1 to 13e4 are arranged along the periphery of the opening 13. The gap 14b is defined between adjacent two of the plurality of second casing-side guide surfaces 13e1 to 13e4 for all the second casing-side guide surfaces 13e1 to 13e4. When viewed in the insertion direction, the electrical components 51 are arranged so as to overlap with the gaps 14b. The gaps 14b are an example of second gaps.

The above-mentioned configuration can suppress an increase in height dimension of the power conversion device in the insertion direction while the lengths of the second casing-side guide surfaces 13e1 to 13e4 in the insertion direction are increased.

In this embodiment, the connector 20 has been exemplified as the insertion component. However, the insertion component is not limited to the connector 20. For example, when a casing lid is inserted into an opening of a casing and a gasket is provided between an outer peripheral surface of the casing lid and an inner wall surface of the opening, the insertion component may be the casing lid.

What is claimed is:

1. A power conversion device, comprising:
a casing that has a front surface with an opening, and is configured to accommodate electrical components;
an insertion component including an insertion portion inserted from the front surface side into the opening; and
a gasket provided between the insertion portion and the opening,
wherein the casing has an inner wall surface being in contact with the gasket and a casing-side guide surface located on an inner side of the casing with respect to the inner wall surface in an insertion direction for the insertion portion,
wherein the casing-side guide surface is located on an inner periphery side of the opening with respect to the inner wall surface,
wherein the insertion portion has an outer peripheral surface being in contact with the gasket and at least one insertion component-side guide surface located on the inner side of the casing with respect to the outer peripheral surface in the insertion direction,
wherein the at least one insertion component-side guide surface is opposed to the casing-side guide surface,
wherein, when a distance in the insertion direction between the front surface and an end of the casing-side guide surface, which is closer to the front surface in the insertion direction, is represented by L1 and a distance between an inner surface of the gasket in the insertion direction and a distal end of the at least one insertion component-side guide surface in the insertion direction is represented by L2, the distance L2 is set larger than the distance L1.

2. The power conversion device according to claim 1,
wherein the at least one insertion component-side guide surface is a plurality of insertion component-side guide surfaces,
wherein the plurality of insertion component-side guide surfaces are arranged along a periphery of the insertion portion,
wherein a first gap is defined between adjacent two of the plurality of insertion component-side guide surfaces for all the insertion component-side guide surfaces, and
wherein, when viewed in the insertion direction, the electrical components are arranged so as to overlap with the first gaps.

3. The power conversion device according to claim 2,
wherein the plurality of insertion component-side guide surfaces comprise a first insertion component-side guide surface and a second insertion component-side guide surface, and
wherein, when viewed in the insertion direction, a position of the first insertion component-side guide surface and a position of the second insertion component-side guide surface are different from each other by 180 degrees about a center axis of the insertion portion.

4. The power conversion device according to claim 1,
wherein the insertion component further has a flange surface being in contact with the front surface,
wherein the insertion portion further has an insertion component-side stepped surface facing the inner side of the casing in the insertion direction,
wherein the insertion component-side stepped surface is located on an outer side of the casing with respect to the gasket in the insertion direction, and
wherein the gasket is in contact with the insertion component-side stepped surface.

5. The power conversion device according to claim 1, wherein the at least one insertion component-side guide surface is flush and continuous with the outer peripheral surface.

6. The power conversion device according to claim 1,
wherein the casing further has a casing-side stepped surface facing an outer side of the casing in the insertion direction, and
wherein the casing-side stepped surface is located between the inner wall surface and the casing-side guide surface.

7. The power conversion device according to claim 1,
wherein the casing-side guide surface includes a first casing-side guide surface and a plurality of second casing-side guide surfaces located on the inner side of the casing with respect to the first casing-side guide surface in the insertion direction,
wherein the plurality of second casing-side guide surfaces are arranged along a periphery of the opening,
wherein a second gap is defined between adjacent two of the plurality of second casing-side guide surfaces for all the second-casing side guide surfaces, and
wherein, when viewed in the insertion direction, the electrical components are arranged so as to overlap with the second gaps.

* * * * *